United States Patent [19]
Tanaka

[11] Patent Number: 5,189,318
[45] Date of Patent: Feb. 23, 1993

[54] ANALOG SIGNAL EXTRACTING CIRCUIT
[75] Inventor: Junji Tanaka, Sakurai, Japan
[73] Assignee: Sharp Kabushiki Kaisha, Osaka, Japan
[21] Appl. No.: 774,830
[22] Filed: Oct. 11, 1991
[30] Foreign Application Priority Data Oct. 19, 1990 [JP] Japan .................................. 2-282872

[51] Int. Cl.$^5$ .................... H03K 5/153; H03K 17/687
[52] U.S. Cl. ..................................... 307/352; 307/362;
307/363; 307/494; 307/585; 307/496; 307/497;
330/253
[58] Field of Search ............... 307/352, 353, 354, 362,
307/363, 494, 496, 497, 518, 571, 581, 585, 242;
330/290, 253

[56] References Cited

U.S. PATENT DOCUMENTS

| 3,984,780 | 10/1976 | Hsiao et al. | 330/253 |
|---|---|---|---|
| 4,394,587 | 7/1983 | McKenzie et al. | 307/359 |
| 4,462,002 | 7/1984 | Schade, Jr. | 330/253 |
| 4,463,588 | 8/1984 | Wieser | 307/496 |
| 4,503,340 | 3/1985 | Linder | 307/363 |
| 4,733,107 | 3/1988 | O'Shaughnessy et al. | 307/359 |
| 4,797,569 | 1/1989 | Boyacigiller | 307/359 |
| 4,881,045 | 11/1989 | Dillman | 330/253 |
| 4,990,862 | 2/1991 | Narabu et al. | 330/253 |
| 5,030,922 | 7/1991 | Rumreich et al. | 330/253 |
| 5,061,862 | 10/1991 | Tamagawa | 307/296.1 |

FOREIGN PATENT DOCUMENTS 2-92008  3/1990  Japan .

Primary Examiner—William L. Sikes
Assistant Examiner—Terry D. Cunningham

[57] ABSTRACT

An analog signal extracting circuit includes a sampling gate for sampling an analog input voltage, a differential amplifier for receiving the output of the sampling gate, and a buffer for buffering the output of the differential amplifier. The differential amplifier has a p-channel MOS transistor serving as an input transistor. The sampling gate applies a voltage to a gate of the p-channel MOS transistor. The buffer has a source follower type n-channel MOS transistor. The differential amplifier applies its output to a gate of the n-channel MOS transistor.

2 Claims, 2 Drawing Sheets

ANALOG SIGNAL EXTRACTING CIRCUIT

BACKGROUND OF THE INVENTION

1. Field of the Invention

The present invention relates to an analog signal extracting circuit used for sampling an analog signal.

2. Description of the Related Art

FIG. 2 is a circuit diagram showing an arrangement of an analog signal extracting circuit known by the present inventor.

12 denotes a transmission gate for sampling an analog input voltage applied to an input terminal 11. The sampling of the analog voltage is carried out each time the transmission gate 12 becomes conductive.

At the next stage of the transmission gate 12, a differential amplifier 14 and a buffer 15 constitute a voltage follower circuit 13. The voltage follower circuit 13 serves to supply at an output terminal 16 a voltage equal to the input voltage sampled by the transmission gate 12.

The differential amplifier 14 includes p-channel MOS transistors Q11 and Q12 constituting a current mirror circuit 17, an n-channel MOS transistor Q13 serving as an input transistor, an n-channel MOS transistor Q14 serving as an output transistor, and an n-channel MOS transistor Q15 serving as a constant current source. The sources of the MOS transistors Q11 and Q12 are connected to a constant voltage source VDD. The gate of the MOS transistor Q15 is connected to a bias power supply Vb11 and the source of the MOS transistor Q15 is grounded.

The buffer 15 includes n-channel MOS transistors Q16 and Q17 connected in series between the constant voltage source Vdd and the ground. A contact point between the MOS transistors Q16 and Q17 is connected to the output terminal 16 and the gate of the MOS transistor Q14 of the differential amplifier 14. The gate of the MOS transistor Q16 which serves as an input transistor for receiving an output of the differential amplifier 14, is connected to the drain of the MOS transistor Q14 which serves as an output transistor of the differential amplifier 14. The source and the back gate of the MOS transistor Q16 are connected to the output terminal 16 to constitute a source follower circuit. The gate of the MOS transistor Q17 is connected to a bias power supply Vb12.

The analog signal extracting circuit basically functions as follows.

The input voltage which has passed the transmission gate 12 is applied to the gate of the MOS transistor Q13 which serves as an input transistor of the differential amplifier 14. Depending on variation of the input voltage, the drain voltage of the MOS transistor Q14 varies. The drain voltage of the MOS transistor Q14 is applied to the gate of the MOS transistor Q16 of the buffer 15. Depending on variation of the drain voltage of the MOS transistor Q14, that is, depending on variation of the voltage inputted to the differential amplifier 14, the MOS transistor Q16 varies its resistance when it is on, that is, when it is conductive. As a result, the MOS transistor Q16 outputs a voltage equal to the input voltage sampled at the transmission gate 12 from the output terminal 16.

In the foregoing analog signal extracting circuit, in a case where a positive voltage input to the differential amplifier 14 is lower than the threshold voltage of the enhancement type n-channel MOS transistor Q13, the MOS transistor Q13 is in an off state so that the differential amplifier does not function. In such a condition, the differential amplifier 14 cannot function normally and the output voltage is restricted when the input voltage is lower than the threshold voltage of the MOS transistor Q13. Hence, the minimum value of the output voltage obtained at the output terminal 16 depends on the threshold voltage of the MOS transistor Q13.

On the other hand, the maximum value of the voltage output at the output terminal 16 depends on the threshold voltage of the MOS transistor Q16 constituting the buffer 15. That is, the output voltage at the output terminal 16 is limited to be lower than the resultant voltage of subtracting the threshold voltage of the MOS transistor Q16 from the constant voltage source Vdd.

This limitation brings about a shortcoming for the normal functioning of the circuit in that an effective range of the input and output voltages with respect to the given constant voltage source VDD is made narrower accordingly.

SUMMARY OF THE INVENTION

It is, therefore, an object of the present invention to provide an analog signal extracting circuit which has a wide effective range of the input and output voltages.

In carrying out the object in a preferred mode, the analog signal extracting circuit includes a sampling gate for sampling an analog input voltage, a differential amplifier having a first p-channel MOS transistor which serves as an input transistor for receiving an analog voltage outputted from the sampling gate, the analog voltage being applied to a gate of the first p-channel MOS transistor, second and third p-channel MOS transistors and first and second n-channel MOS transistors, and a buffer having a source follower type third n-channel MOS transistor having a gate to which an output of the differential amplifier is applied.

Since the input transistor of the differential amplifier is constituted by the first p-channel MOS transistor, the minimum value of the input voltage, which allows the differential amplifier to function normally, can be dropped to the lower potential of the power-supply voltage of the differential amplifier, that is, to the ground level. As a result, the effective range of the input and output voltages is increased.

Further objects and advantages of the present invention will be apparent from the following description, reference being had to the accompanying drawings wherein a preferred embodiment of the present invention is clearly shown.

DESCRIPTION OF PREFERRED EMBODIMENTS

Figure 1:
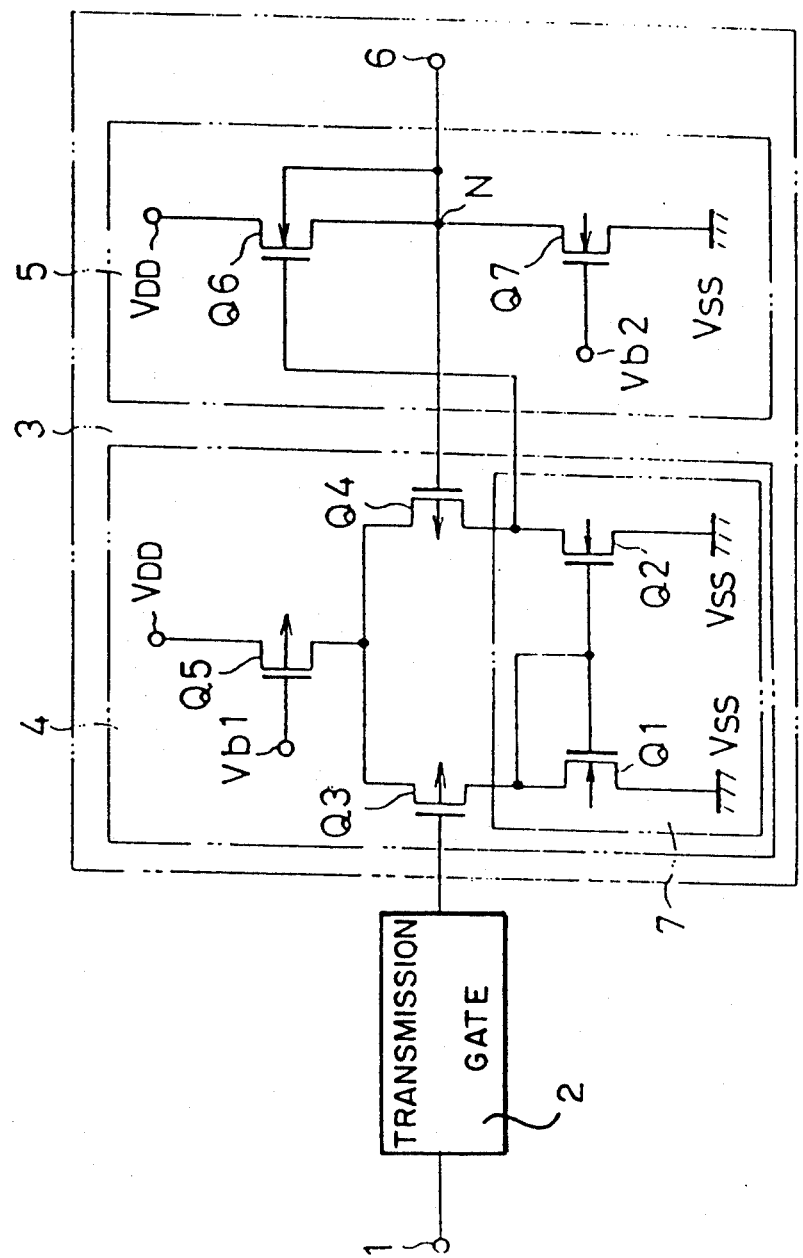
FIG. 1 is a circuit diagram showing an analog signal extracting circuit according to an embodiment of the present invention.
Figure 2:
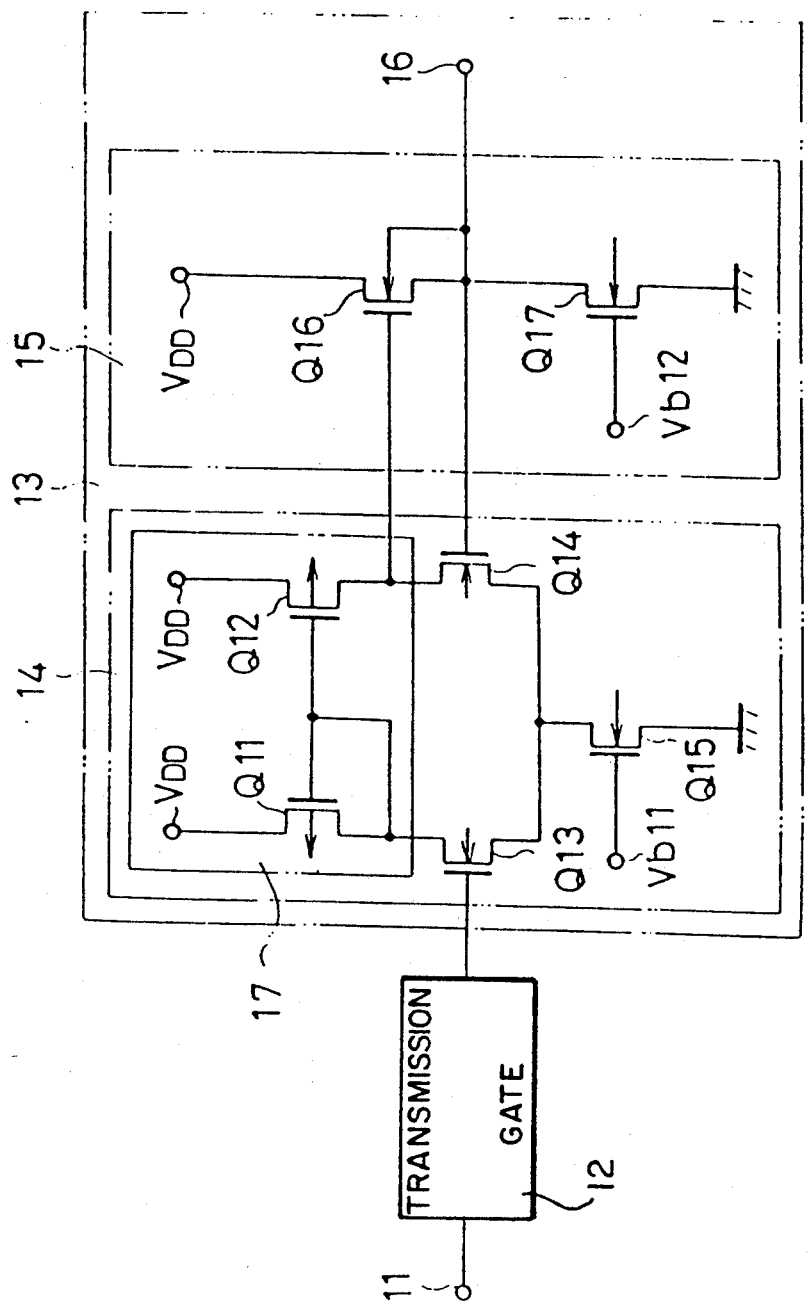
FIG. 2 is a circuit diagram showing an analog signal extracting circuit according to the related art of the present invention.

FIG. 1 is a circuit diagram showing an analog signal extracting circuit according to an embodiment of the present invention.

2 denotes a transmission gate which serves to sample an analog input voltage at an input terminal 1. The analog input voltage is sampled each time the transmission gate 2 becomes conductive.

At the next stage of the transmission gate 2, a differential amplifier 4 and a buffer 5 are provided to constitute a voltage follower circuit 3. The voltage follower circuit 3 serves to output a voltage equal to the voltage sampled by the transmission gate 2 from an output terminal 6.

The differential amplifier 4 includes n-channel MOS transistors Q1 and Q2 constituting a current mirror circuit 7, a p-channel MOS transistor Q3 serving as an input transistor, a p-channel MOS transistor Q4 serving as an output transistor, and a p-channel MOS transistor Q5 serving as a constant current source.

The sources of the MOS transistors Q1 and Q2 constituting the current mirror circuit 7 are connected to the ground, that is, to the low potential of the constant voltage source Vss. The gate of the MOS transistor Q5 is connected to a bias power supply Vb1 and the source of the MOS transistor Q5 is connected to the high potential of the constant voltage source VDD. The gates of the MOS transistors Q1 and Q2 are connected to each other. The gate and the drain of the MOS transistor Q1 are connected to the drain of the MOS transistor Q3. The drain of the MOS transistor Q2 is connected to the drain of the MOS transistor Q4. The sources of the MOS transistors Q3 and Q4 are both connected to the drain of the MOS transistor Q5.

The buffer 5 includes n-channel MOS transistors Q6 and Q7 connected in series between the constant voltage source VDD and the ground. The drain of the MOS transistor Q6 is connected to the constant voltage source VDD and the source of the transistor Q6 is connected to the drain of the MOS transistor Q7. The source of the transistor Q7 is connected to the ground. The contact point N of the MOS transistors Q6 and Q7 is connected to the output terminal 6 and to the gate of the MOS transistor Q4 of the differential amplifier 4. The output terminal 6 is also connected to the back gate of the MOS transistor Q6.

The gate of the MOS transistor Q6, serving as an input transistor for receiving an output voltage of the differential amplifier 4, is connected to the drain of the MOS transistor Q4, that is, the output terminal of the differential amplifier 4. The source of the transistor Q6 is connected to the output terminal 6. Whereby the MOS transistor Q6 constitutes a source follower circuit.

The gate of the MOS transistor Q7 is connected to a bias power supply Vb2.

The operation of the analog signal extracting circuit will now be described.

The input voltage which has passed the transmission gate 2 is applied to the gate of the MOS transistor Q3 serving as an input transistor of the differential amplifier 4.

The current flowing through the MOS transistors Q3 and Q1 and the current flowing through the MOS transistors Q4 and Q2 are kept constant and equal to each other by the effect of the constant current source constituted by the MOS transistor Q5 and the current mirror circuit 7 constituted by the MOS transistors Q1 and Q2. Hence, when the input voltage to the gate of the MOS transistor Q3 lowers and the MOS transistor Q3 decreases its resistance and decreases its source voltage, for example, the MOS transistor Q4 serving as an output transistor lowers its drain voltage by the effect of the current mirror circuit 7 accordingly. Since the drain voltage of the MOS transistor Q4 is supplied to the gate of the MOS transistor Q6 of the buffer 5, the MOS transistor Q6 increases its resistance and accordingly the output voltage appearing at the output terminal 6 is lowered. Conversely, when the voltage inputted from the transmission gate 2 to the differential amplifier 4 rises, the output voltage at the output terminal 6 also rises accordingly.

As described above, an output voltage equal to the voltage inputted from the transmission gate 2 to the differential amplifier 4 is obtained at the output terminal 6.

Since the MOS transistor Q3 serving as an input transistor of the differential amplifier 4 is an enhancement type p-channel transistor, the transistor Q3 is switched off when the positive voltage inputted to its gate exceeds the threshold voltage resulting in stopping the operation of the differential amplifier 4. As long as the input voltage is kept at a value between the ground level and the threshold voltage of the transistor Q3, the transistor Q3 is switched on so that the differential amplifier 4 is made operative. That is, in the differential amplifier 4, any input voltage within the range from the ground potential to the threshold voltage of the transistor Q3 is effective.

If the threshold voltage of the transistor Q3 is made equal to a voltage which is smaller than the power-supply voltage of the constant voltage source VDD by the threshold voltage Vth of the MOS transistor Q6, the effective maximum value of the input voltage may match to the maximum value of the output voltage.

Many widely different embodiments of the present invention may be constructed without departing from the spirit and scope of the present invention. It should be understood that the present invention is not limited to the specific embodiment described in this specification, except as defined in the appended claims.

What is claimed is:

1. An analog signal extracting circuit comprising:
   a sampling gate for sampling an analog input voltage;
   a differential amplifier which receives an analog voltage outputted from said sampling gate, said differential amplifier including,
   a first p-channel MOS transistor having a source connected to a power supply and a gate connected to a first bias power supply,
   a second p-channel MOS transistor having a source connected to a drain of said first p-channel MOS transistor and a gate connected to said sampling gate,
   a third p-channel MOS transistor having a source connected to said drain of said first p-channel MOS transistor,
   a first n-channel MOS transistor having a gate and a drain each connected to a drain of said second p-channel MOS transistor and a source connected to ground, and
   a second n-channel MOS transistor having a drain connected to a drain of said third p-channel MOS transistor, a gate connected to said gate of said first n-channel MOS transistor and a source connected to the ground; and
   a buffer to which an output of said differential amplifier is applied, said buffer including,
   a third n-channel MOS transistor having a drain connected to said power supply, a gate connected to said drain of said third p-channel MOS transistor and a source connected to a gate of said third p-channel MOS transistor, a fourth n-channel MOS transistor having a drain connected to said source of said third n-channel MOS transistor, a gate connected to a second bias power supply and a source connected to the ground, and
  an output terminal connected to said source of said third n-channel MOS transistor.

2. An analog signal extracting circuit comprising:
a sampling gate for sampling an analog input voltage;
a differential amplifier which receives an analog voltage outputted from said sampling gate, said differential amplifier including,
  a first p-channel MOS transistor having a source connected to a power supply and a gate connected to a first bias power supply,
  a second p-channel MOS transistor having a source connected to a drain of said first p-channel MOS transistor and a gate connected to said sampling gate,
  a third p-channel MOS transistor having a source connected to said drain of said first p-channel MOS transistor,
  a first n-channel MOS transistor having a gate and a drain each connected to a drain of said second p-channel MOS transistor and a source connected to ground, and
  a second n-channel MOS transistor having a drain connected to a drain of said third p-channel MOS transistor, a gate connected to said gate of said first n-channel MOS transistor and a source connected to the ground; and
a buffer to which an output of said differential amplifier is applied, said buffer including,
  a third n-channel MOS transistor having a drain connected to said power supply, a gate connected to said drain of said third p-channel MOS transistor and a source connected to a gate of said third p-channel MOS transistor,
  a fourth n-channel MOS transistor having a drain connected to said source of said third n-channel MOS transistor, a gate connected to a second bias power supply and a source connected to the ground, and
  an output terminal connected to said source of said third n-channel MOS transistor and a back gate of said third n-channel MOS transistor being connected to said output terminal.

* * * * *